United States Patent

[11] 3,621,338

[72] Inventors Bryant C. Rogers
La Jolla;
Wilbur T. Wakely, San Diego, both of Calif.

[21] Appl. No. 346
[22] Filed Jan. 2, 1970
[45] Patented Nov. 16, 1971
[73] Assignee Fairchild Camera and Instrument Corporation
Syosset, N.Y.

[54] DIAPHRAGM-CONNECTED, LEADLESS PACKAGE FOR SEMICONDUCTOR DEVICES
8 Claims, 8 Drawing Figs.

[52] U.S. Cl. ........................................ 317/101 CC, 317/101 CM, 317/101 D, 317/100, 339/17
[51] Int. Cl. ........................................ H05k 1/014
[50] Field of Search ........................................ 317/101 CM, 101 CX, 101 CC, 101 CP, 101, 100, 101 D; 339/95–97, 18, 17 M, 17 LM, 17 LC; 29/628, 630 G

[56] References Cited

UNITED STATES PATENTS

| | | | |
|---|---|---|---|
| 3,022,480 | 2/1962 | Tiffany | 339/95 A |
| 3,484,534 | 12/1969 | Kilby et al. | 317/101 CP |
| 2,502,291 | 3/1950 | Taylor | 317/101 CM UX |
| 2,512,820 | 6/1950 | Bader | 339/18 C UX |
| 2,794,869 | 6/1957 | Noregaard | 200/46 |
| 3,346,773 | 10/1967 | Lomerson | 317/100 |
| 3,365,620 | 1/1968 | Butler et al. | 317/101 CP UX |
| 3,370,203 | 2/1968 | Kravitz et al. | 317/101 D UX |
| 3,509,268 | 4/1970 | Schwartz et al. | 317/101 CM UX |

*Primary Examiner*—David Smith, Jr.
*Attorneys*—Roger S. Borovoy and Alan H. MacPherson

ABSTRACT: A thin patterned conductive foil is embedded between a pair of adjacent dielectric layers, at least one of which has a hole pattern therein. Portions of the foil cover the holes, so that upon insertion of conductive material into the holes to puncture the foil, electrical contact is provided therebetween.

INVENTORS
BRYANT C. ROGERS
WILBUR T. WAKELY
BY Alan H. MacPherson
ATTORNEY

INVENTORS
BRYANT C. ROGERS
WILBUR T. WAKELY
BY Alan H. MacPherson
ATTORNEY

DIAPHRAGM-CONNECTED, LEADLESS PACKAGE FOR SEMICONDUCTOR DEVICES

BACKGROUND OF THE INVENTION

1. Field of the Invention

This invention relates to a diaphragm-connected, leadless package for semiconductor devices. In particular, this invention relates to a semiconductor device package wherein all protruding external leads have been eliminated, but external connection is provided by a diaphragm that is punctured by pointed leads, usually provided from another system.

2. Description of the Prior Art

A semiconductor device is usually assembled into a package that allows external connections to be made to selected portions of a semiconductor die that is encapsulated in the package and protected from the environment. Typically, the external connections are provided by terminal leads, one end of which is attached to the package while the other end protrudes from the package into the environment. As the number and complexity of functions a semiconductor device is required to perform increases, the number of leads that must protrude from the package to provide for external connection, of necessity, increases, which in turn creates packaging problems. A single transistor usually needs only three external leads, and is relatively easy to package. Large-scale integrated devices and semiconductor memories, on the other hand, require up to several orders of magnitude more external leads than the simple transistor. Because of improved efficiencies and techniques in the fabrication of the semiconductor wafers, often the leads themselves are the largest single item of expense in the total cost of manufacturing a semiconductor device.

When many terminal leads protrude externally from a package, it is often necessary to provide a socket into which the free end of each of the protruding leads can be inserted. With many leads, however, of necessity each lead must be small to allow enough space for the other leads extending from the same package. Small leads are easily bent, resulting in serious misalignment problems with the socket. As the number of leads needed increases, the protruding-lead, socket approach becomes expensive as well as difficult, because the socket itself often costs more than the semiconductor device. Moreover, reliability of the device is adversely affected as the number of connections needed per device increases.

Propagation delay, which is the time required for an electrical signal to travel through the device, is a function of the length of the protruding leads, as the latter helps determine the length of the signal path. Many protruding leads often result in an undesirably long signal path in the leads themselves. Moreover, unless a special heat dissipation means is provided, use of long leads results in a long thermal path through the device, causing heat dissipation problems. Heating problems also arise whenever many hermetically sealed devices are packaged together, particularly if the power consumption is around 5 watts or more.

When a semiconductor package having a multiplicity of protruding external leads is assembled but not yet ready for insertion into a socket, other problems arise. In order to transport the package, a carrier must be provided during shipment not only for the package but also for the free end of the extended leads to prevent them from bending or twisting, or from stress being applied to the leads causing a break in the glass-to-metal seal within the package. Special carriers for transporting packages with multiple leads are expensive, and the overall cost per device increases.

In the prior art, in order to obtain a glass-to-metal seal in a conventional package, the material selected for the protruding, external leads (typically Kovar or Dumet) must be capable of withstanding the subsequent high-temperature sealing steps. However, these materials, particularly Kovar or Dumet, may not be as desirable as other kinds of materials for the hardware manufacturer. For example, stainless steel leads, incompatible with the high temperatures needed to seal glasses, are often preferred for wire-wrapping operations of the computer manufacturer. Thus, there is often a conflict between the needs of the semiconductor manufacturer and that of the hardware manufacturer.

As the number of external leads protruding from a semiconductor package has increased, it has been more economical in the prior art to make a lead frame using a punch press. However, it is difficult to stamp the lead frame unless the width of each of the leads is at least around 10 mils; this limitation is undesirable for small devices capable of performing complex functions and needing many external leads.

Furthermore, the relatively large size (such as on the order of 10 mils) of a conventional lead does not permit direct connection to a very small semiconductor device. Thus, interconnection between the semiconductor die and a lead of the frame is made via use of a fine wire. When many such interconnection wires are required, however, the reliability of the device consequently decreases, and labor costs increase.

Although some prior art leadless packages have been used, they generally have been satisfactory only for devices needing a small number of external connections, such as from three to five, and not for multilead assemblies. Moreover, interconnection into another system is accomplished by use of solder reflow or other conductive adhesive, which results in hidden connections and does not allow inspection of each connection point for reliability.

These and other disadvantages of prior art semiconductor packaging techniques indicate that a new approach is needed, particularly for very small semiconductor die requiring a large number of external electrical connections.

SUMMARY OF THE INVENTION

The diaphragm-connected, leadless package of the invention eliminates the above-mentioned prior art problems arising from multiple protruding external leads by eliminating the need for leads that protrude from the package, while providing a means for many external electrical connections to selected portions of a semiconductor die sealed within the package. Because there are no protruding external leads, there is also no need to provide sockets into which the free ends of the leads are inserted. Thus, a substantial expense, as well as many of the problems of prior art packaging, have been reduced or eliminated.

Briefly, the diaphragm-connected, leadless package of the invention comprises a pair of adjacent dielectric layers, each having a predetermined pattern of holes extending therethrough. A patterned conductive foil is embedded between the dielectric layers and selectively aligned with the hole pattern thereof. Attached to and electrically connected with selected portions of the foil is a semiconductor die. A support member attached to at least one of the two dielectric layers, provides support for the die. Suitably, a portion of the member extends past the dielectric layers to allow for the dissipation of heat from the die. A plurality of such diaphragm-connected leadless packages can be stacked, one on top of the other, in a predetermined arrangement, suitably with the hole pattern of each selectively aligned and interconnected as desired. Electrical connection is made to the device by pointed leads that puncture portions of the foil covering the holes. Typically, the pointed leads are provided from another system.

DESCRIPTION OF THE PREFERRED EMBODIMENT

Figure 1:
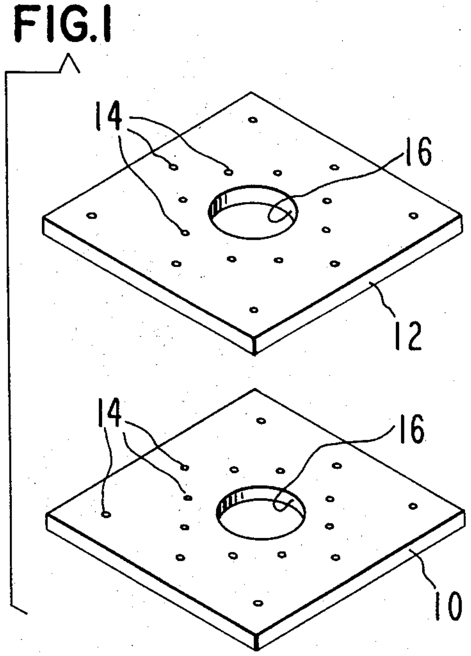
FIG. 1 is a simplified isometric drawing of a pair of adjacent dielectric layers having a predetermined hole pattern therein.

Referring to FIG. 1, a pair of dielectric layers 10 and 12 are located adjacent one another, with each layer having a pattern of holes, such as hole 14, located therein. Suitably, hole 14 is approximately 50 mils in diameter. Preferably, the hole pattern in layer 10 is alignable with the hole pattern in layer 12. Another opening, such as hole 16, is located in layers 10 and 12 to provide for attaching a support member and semiconductor die during a subsequent fabrication step.

Preferably, dielectric layers 10 and 12 are insulators and conveniently comprise alumina ceramic or an equivalent dielectric material, approximately 20 to 40 mils thick, which can be fabricated by standard ceramic fabrication processes. Although layers 10 and 12 in FIG. 1 are depicted as having many small holes 14 and a larger hole 16, it is understood that other openings or depressions may be formed within layers 10 and 12 as desired. For example, provision can be made for passive components in the form of thin strips of film material attached to layer 10 or 12, or both.

Figure 2:
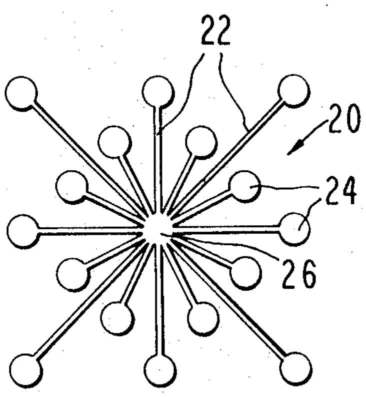
FIG. 2 is a simplified isometric drawing of a patterned conductive foil.

Referring to FIG. 2, patterned foil 20 comprises a conductive material compatible with dielectric layers 10 and 12 such as Kovar or aluminum-clad Kovar, whose terminal coefficient of expansion approximately matches that of alumina ceramic. A preferred pattern for foil 20 is as shown in FIG. 2, which consists of a plurality of thin conductive strips 22 having an enlarged portion 24 on one end, with the other end coming together at central portion 26. The enlarged portions 24 are designed to align with and overlap holes 14 of layers 10 and 12 (see FIG. 1), so that portions 24 function as diaphragms and provide for external electrical connection upon being punctured by pointed leads, as described hereinafter. Central portion 26 functions to hold strips 22 in alignment until the former is removed.

Because strips 22 are subsequently embedded between supporting dielectric layers 10 and 12, they can be extremely thin, on the order of approximately 1 mil, thus permitting photoresist and etching, as well as stamping, techniques to be used to create the desired pattern in the foil. For example, a sheet of Kovar, approximately 1 mil thick, is placed on a supporting substrate. A desired pattern is then delineated by photoresist and etching steps. The etching step may proceed from one side only due to the thin foil 20, without undesirable problems of undercutting arising. This feature can be contrasted with prior art leads typically approximately 10 mils thick, so that the etching step had to be performed simultaneously from opposite surfaces of the leads in order to prevent unwanted undercutting by the etchant. With the thin 1-mil leads of the invention, however, the etchant quickly cuts through the Kovar sheet before harmful undercutting occurs. Moreover, the structure of the invention allows thin 1-mil strips to be formed having a separation between strips of only approximately 3 mils. By comparison, with the stamping approach of the prior art, it is difficult to form a lead frame unless the separation between the leads is approximately 10 mils, or more. Thus, more strips per unit area are now possible, according to the invention.

Figure 3:
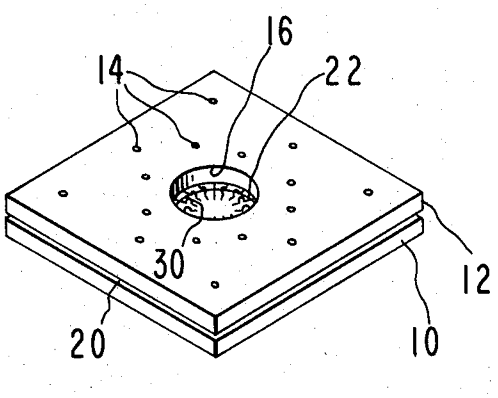
FIG. 3 is a simplified isometric drawing of the patterned foil embedded between the pair of dielectric layers, with the center of the foil removed and stress-relieving bends formed in the foil strips.

Referring to FIG. 3, the patterned foil 20 of FIG. 2 is embedded between the pair of dielectric layers 10 and 12, so that the enlarged portions 24 of leads 22 are selectively aligned with hole patterns 14 of layers 10 and 12. The central portion 26 of patterned foil 20 is used to facilitate alignment.

Layers 10 and 12 are sealed together by a conventional glass-metal seal, such as borosilicate glass, or by epoxy, after which the central portion 26 is removed, suitably by stamping. During the same step, a stress relieving bend 30 is formed in the exposed portion of each strip 22. Bend 30 allows force to be exerted at either end of strip 22 without causing the remainder of the strip to twist, bend, or otherwise change position, or to stress the bond subsequently made to the semiconductor die by a portion of strip 22.

Figure 4:
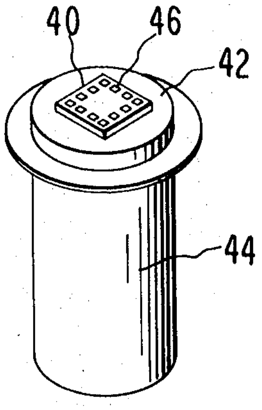
FIG. 4 is a simplified isometric drawing of the semiconductor die, support member, and heat-dissipation extension prior to attachment to the foil and pair of dielectric layers.

Referring to FIG. 4, because strips 22 are extremely thin, the semiconductor die 40 is preferably attached first to support member 42, prior to assembly into the structure of FIG. 3, after which member 42 is attached to one of the dielectric layers 10 and 12. Member 42, suitably comprising a thermally conductive material such as Kovar, functions to support die 40 as contact pads 46 of the latter are held in place against, and in electrical contact with, strips 22. A portion of member 42 includes a lip that allows member 42 to be seated in opening 16 of dielectric layer 10 or 12. Support member 42 also can have a depression located therein so that a heat-dissipation extension 44, preferably of a thermally conductive metal such as aluminum or copper, can be attached thereto and provide a short thermal path from die 40 to the external environment.

Figure 5:
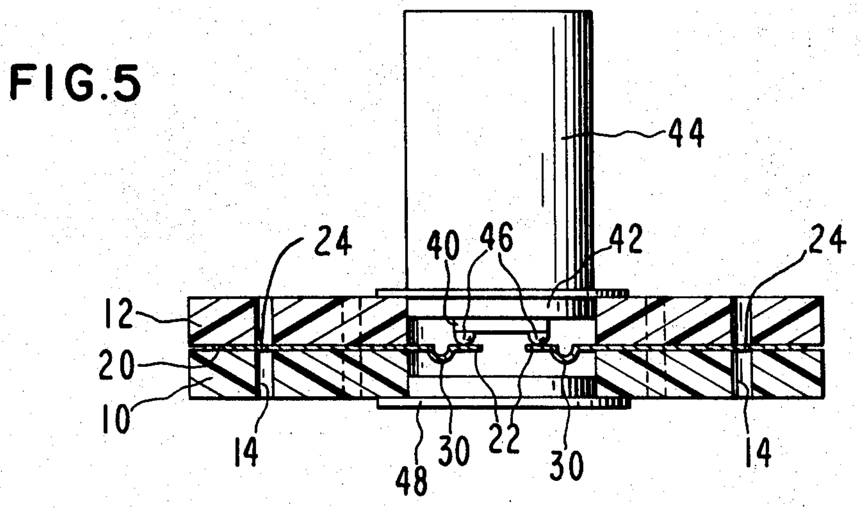
FIG. 5 is a simplified cross-sectional view of the completed package.

Referring to FIG. 5, the semiconductor die 40, support member 42, and heat-dissipation extension 44 are assembled as part of the complete package, with extension 44 protruding past dielectric layers 10 and 12 into the environment. Support member 42 is located in a portion of opening 16 (see FIG. 3) so that contact pads 46 of die 40 are aligned with strips 22, and the lip of member 42 rests against and is attached to dielectric layer 10 or 12. Preferably, strips 22 are firmly attached to contact pads 46 on die 40, suitably by any of a number of semiconductor soldering techniques, such as solder reflow, ultrasonic bonding, thermal-compression bonding, and so forth. After the solder step, visual inspection of each solder connection can be performed through large opening 16 in dielectric layer 10 or 12, whichever is unobstructed.

A cap 48 of material compatible with ceramic layers 10 and 12, suitably Kovar, is then placed over the opening 16 and, if desired, sealed in place, thereby providing a hermetic seal for semiconductor die 40.

Figure 6:
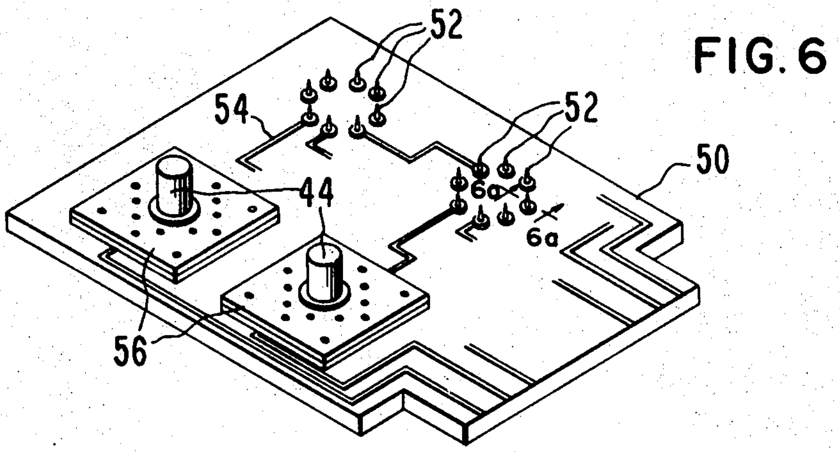
FIG. 6 is a simplified isometric drawing of the package located on a circuit board having pointed leads that are inserted through the holes in the package and puncture selected enlarged portions of the patterned foil to make electrical connection therewith.

Referring to FIG. 6 and 6*l*, in a typical application of the diaphragm-connected, leadless package, a printed circuit board 50 has a plurality of pointed leads 52 located in a predetermined pattern. Layers 54 of conductive material are provided for making interconnections between the pointed leads 52. Leads 52 comprise a suitable conductive material such as brass, and conveniently the tips thereof are coated with solder. For applications where wire wrapping of the leads is desired, the nonpointed portion of leads 52 can extend past board 50, and a wire is then wrapped around this extension. For wire-wrapping applications, lead 52 suitably comprises stainless steel, or other appropriate material.

The leadless package 56 is placed over the pointed leads 52 in such a manner that the hole pattern in package 56 is aligned as desired with pointed leads 52. Note that the combination of pointed leads 52 and pattern of holes 14 allows some misalignment.

The package 56 is next pressed downward onto the pointed leads 52 so that the points thereof puncture the diaphragms 24 that cover holes 14, which provides electrical contact therebetween. In order to ensure permanent electrical connection, a hot gas is passed over pointed leads 52 and punctured diaphragms 24, which reflows the solder connection.

Although the heat-dissipation extension 44 is illustrated in FIG. 5 as protruding up from the printed circuit board 50, as an alternative approach, a thermal connection to a heat sink on the printed circuit board 50 can be made. Extension 40 can be cylindrical in form as shown, or have a finlike shape, or be in any other suitable form, as desired. Moreover, air or a liquid can be circulated around extension 44 to provide for efficient cooling of any heat generated in package 56.

Figure 7:
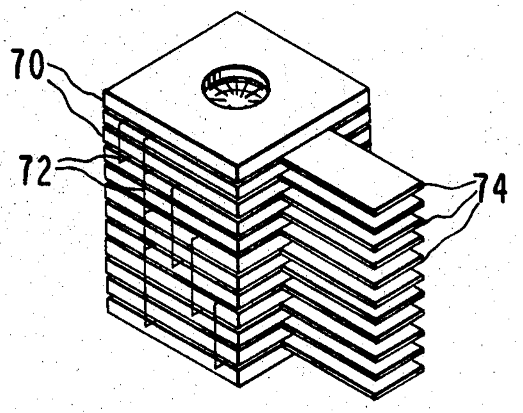
FIG. 7 is a simplified isometric view of a plurality of diaphragm-connected, leadless packages stacked, one on top of the other, and selectively interconnected.
Figure 6A:
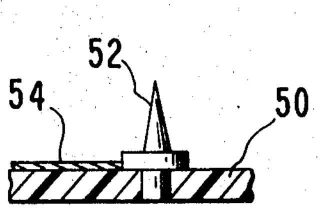
FIG. 6a is a simplified cross-sectional view of a typical pointed lead located in a circuit board.

Referring to FIG. 7, a plurality of diaphragm-connected, leadless packages 70 are stacked together, one on top of the other. Instead of multilayer leads in one package necessary to interconnect several die as in the prior art, layers of packages are provided. Electrical interconnections between each of the layers of packages are provided by internal pointed leads similar to lead 52 as shown in FIG. 6*a*, but having points on both ends. Interconnections between layers of packages also can be made by thin layers 72 of conductive metal, or conductive wires located along the outside of the multilayer structure. Heat-dissipation extensions 74 are suitably located between the stacked packages and extend out into the environment to transfer away heat generated in the package.

While the invention is described with reference to particular embodiments and applications, the scope of the invention is not limited only to these but is susceptible to numerous other applications and embodiments which are readily apparent to one skilled in the art. For example, it is within the scope of the invention to use a suitable molding process to form the package. In such case, the dielectric would comprise a suitable organic material, such as epoxy, and the foil would comprise a compatible conductive material such as copper. Such a structure would be a homogeneous assembly, rather than a sandwich comprising more than one dielectric.

We claim:

1. A package for a semiconductor device comprising:

a pair of adjacent dielectric layers, at least one of the layers having a predetermined pattern of holes extending therethrough;

a readily puncturable patterned conductive foil embedded between the dielectric layers and selectively aligned with the hole pattern and exposing conductive diaphragms accessible through said hole pattern, the foil and the alignment adapted to permit permanent external electrical contact to be made to the foil by insertion of a conductive material into the holes, which conductive material is adapted to puncture said diaphragms;

an opening larger than the holes of said pattern of holes in one of said pair of dielectric layers adapted to receive a support means; and a support means substantially planar with and in intimate contact with said one of said pair of dielectric layers, said support means adapted to support a semiconductor die to be housed within said package.

2. The package as recited in claim 1 further defined by a semiconductor die electrically attached to a portion of the foil.

3. The structure as recited in claim 1 further defined by a portion of said support means extending under and adjacent said to one of the dielectric layers to provide for the dissipation of heat, the portion comprising thermally conductive material.

4. A structure for packaging a plurality of semiconductor dice comprising:

a plurality of pairs of dielectric layers, at least one layer of each pair having a predetermined pattern of holes extending therethrough, each pair stacked, one on top of the other, with the hole pattern of each pair selectively aligned;

a plurality of readily puncturable patterned conductive foils embedded between the dielectric layers, the foils aligned with respective adjacent hole patterns and exposing conductive diaphragms accessible through said hole patterns, the foil and the alignment adapted to permit permanent electrical contacts to be made to the foils by insertion of a conductive material into the holes, which conductive material is adapted to puncture the portions of said conductive foil overlying the holes;

an opening larger than the holes of said pattern of holes in one of said pair of dielectric layers adapted to receive a support means; and at least one support means substantially planar with and in intimate contact with said one of said pair of dielectric layers, said support means adapted to support a semiconductor die to be housed within said package.

5. The structure as recited in claim 4 wherein a foil is embedded between each pair of dielectric layers.

6. The structure as recited in claim 4 further defined by a semiconductor die electrically attached to the foils.

7. The structure as recited in claim 5 further defined by a portion of said support means extending under and adjacent said to one of the dielectric layers to provide for dissipation of heat, the portion comprising thermally conductive material.

8. The structure as recited in claim 4 further defined by a plurality of dual pointed leads located between the pairs of dielectric layers, said leads puncturing the diaphragms covering the holes to provide interconnections between foils.

* * * * *